United States Patent [19]

Davis et al.

[11] Patent Number: 4,515,898
[45] Date of Patent: May 7, 1985

[54] GLASS BONDING MEANS AND METHOD

[75] Inventors: Earl K. Davis, Tempe; James E. Drye; David J. Reed, both of Mesa, all of Ariz.

[73] Assignee: Motorola, Inc., Schaumburg, Ill.

[21] Appl. No.: 614,573

[22] Filed: May 25, 1984

Related U.S. Application Data

[63] Continuation-in-part of Ser. No. 298,435, Sep. 1, 1981, abandoned.

[51] Int. Cl.$^3$ ............................ C03C 3/10; C03C 3/12
[52] U.S. Cl. ........................................ 501/15; 501/18; 501/22; 501/42; 501/75; 501/76
[58] Field of Search ................ 501/42, 22, 75, 76, 501/32, 18, 15

[56] References Cited

U.S. PATENT DOCUMENTS

| | | | |
|---|---|---|---|
| 3,907,535 | 9/1975 | Muller | 501/15 |
| 3,964,920 | 6/1976 | Davis et al. | 501/76 |
| 4,184,189 | 1/1980 | Davis et al. | 65/59.24 |
| 4,405,722 | 9/1983 | Kokubu et al. | 501/15 |

FOREIGN PATENT DOCUMENTS

| | | | |
|---|---|---|---|
| 45-12507 | 5/1970 | Japan | 501/22 |
| 56-120538 | 9/1981 | Japan | 501/76 |
| 7612047 | 5/1977 | Netherlands | 501/75 |

*Primary Examiner*—Helen M. McCarthy
*Attorney, Agent, or Firm*—Robert M. Handy

[57] ABSTRACT

An improved semiconductor die bonding structure and method for electrical devices is described which utilizes a ductile foil between the semiconductor die and the base of the device package. The die is sealed to the foil with a die bonding material formed from a titania free base glass to which has been added 23.6 to 36.4 weight percent lead titanate powder to give a glass plus ceramic mixture consisting essentially of (by weight percent) 2.5–10.7% $GeO_2$, 0–2.3% $SiO_2$, 58.6–78.5% PbO, 0–5.3% $PbF_2$, 7–13% $B_2O_3$, 2.5–6.9% $Al_2O_3$, 0–5.3% ZnO, 0.4–2.3% $V_2O_5$, 0–5.3% CdO, and 6.2–9.6% $TiO_2$. The ductile foil is bonded to the ceramic package base directly without intermediate layers or alternatively by means of an improved foil bonding glass material consisting essentially of (by weight percent) 10–15% $SiO_2$, 45–55% PbO, 8–12% ZnO, 2–5% $Al_2O_3$, and 25–30% $B_2O_3$.

3 Claims, 6 Drawing Figures

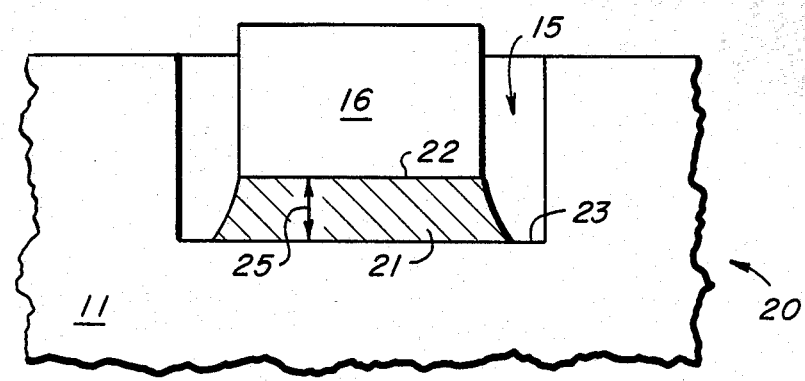
FIG. 2 - PRIOR ART -
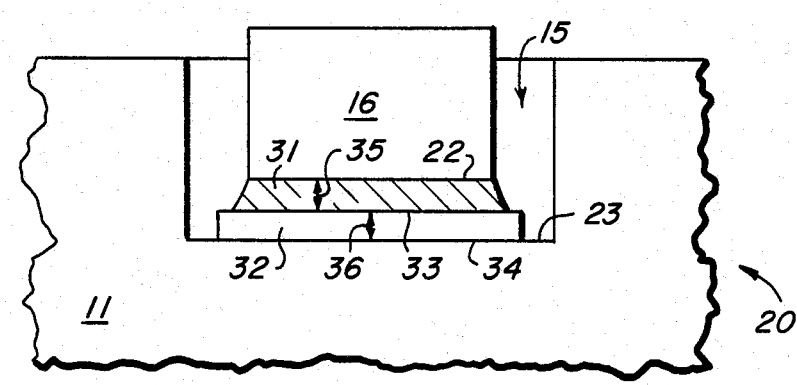
FIG. 3
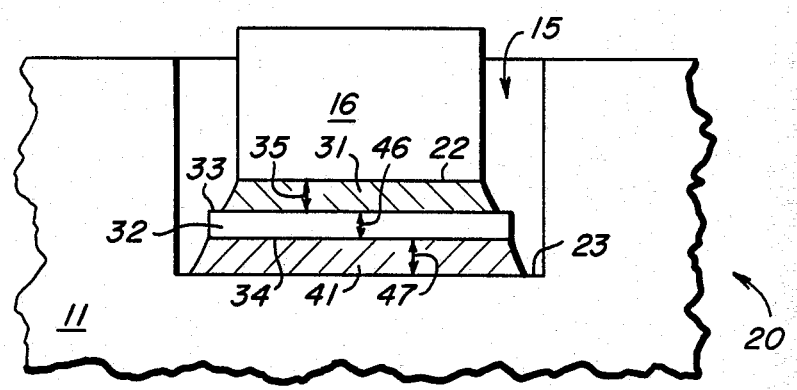
FIG. 4

GLASS BONDING MEANS AND METHOD

This is a continuation in part of application Ser. No. 298,435, filed Sept. 1, 1981, now abandoned.

BACKGROUND OF THE INVENTION

1. Field of the Invention

This invention relates, in general, to means, methods and materials for mounting electrical devices in packages; and, more particularly, to improved glass compositions, methods, and structures for bonding a semiconductor die to a ceramic base, and to improve semiconductor devices utilizing these materials, methods, and structure.

2. Description of the Prior Art

Metal, ceramics, glasses, and glass-ceramic mixtures are commonly used for packaging electrical devices such as semiconductor die in protective enclosures. The semiconductor die may comprise, for example, an individual element such as a diode, resistor, or transistor, an assembly of such elements, or may be an integrated circuit contaning hundreds or thousands of elements. The package or protective enclosure can contain one or more semiconductor die and may have from two to a hundred or more external electrical leads.

The cerdip package is a common form of semiconductor device package widely used in industry today. It consists, typically, of an alumina ceramic base to which the semiconductor die is bonded, a lead frame for external contacts also bonded to the ceramic base, interconnections coupling the lead frame to the die, and a protective lid over the die and interconnections. Typical means used to bond the semiconductor die to the package base are: organic layers (e.g. metal or glass loaded epoxy;) glass layers (e.g. low temperature bonding glasses or glass-ceramic mixtures; or metal layers (e.g. metal layers evaporated on the semiconductor die and screened and fired on the ceramic base, and then alloyed together to fix the die to the base). Heat or heat and pressure are common means for forming the bond. Sometimes the bond is "scrubbed"; that is, the die is moved back and forth laterally in contact with the base, during bonding, in order to achieve a more homogenous bond region.

The physical characteristics of the bond region between the die and base are of great importance since they are a significant factor in determining the thermal impedance between the die where heat is generated and the exterior of the package base from which heat is extracted. Metal bonding layers, because they employ highly conductive materials, generally give lower thermal impedance. However, metal bonding layers use expensive materials and are more complex to make. Thus, devices utilizing them are more expensive. Bonding layers made of glass, are less costly but exhibit higher thermal impedance. Organic bonding layers exhibit still higher thermal impedance.

Measurements on a 64×64 mil (1.6×1.6 mm) silicon semiconductor die bonded to a 16-pin cerdip package base with a gold eutectic metal bonding layer gave a junction-to-case thermal impedance $\theta_{JC}$ of about 20° C. per watt. The gold eutectic bond was about 2 mils (51 μm thick). The $\theta_{JC}$ for the same chip and base bonded with a 2-3 mil (51-76 mm) thick glass layer of the prior art was 30°-40° C. per watt or higher. Type DIP-3, a commercially available bonding glass manufactured by Kyocera of Kyoto, Japan was used.

Attempts to lower the junction-to-case thermal impedance of prior art glass bonded die by making the glass layer thinner have been unsuccessful. The stress applied to the die due to the thermal expansion and contraction mismatch of the silicon and the alumina base depends on the glass thickness. The stress increases as the glass thickness decreases. Below about 2 mils (51 μm), the stress exceeds the yield strength of the silicon semiconductor die and fracture occurs. Thus, with prior art glass bonding materials, thinner glass layers have not been practicable and improved $\theta_{JC}$ of semiconductor devices utilizing glass bonded die could not be achieved. Therefore, a need has continued to exist for means, methods, and materials for achieving improved glass bonding of semiconductor die and other components, and for achieving improved electrical devices having the lower thermal impedance using glass bonding.

Accordingly, it is an object of the present invention to provide improved bonding and sealing material compositions for coupling electrical devices, particularly semiconductor die, to package bases.

It is further object of the present invention to provide improved bonding and sealing material compositions for coupling electrical devices to an intermediate ductile foil which is in turn coupled to a ceramic package base.

It is an additional object of the present invention to provide improved bonding and sealing material compositions for coupling the ductile intermediate foil to the ceramic package base.

It is a further object of the present invention to provide an improved method for bonding a ductile foil to a ceramic base and, further, a method wherein the foil is substantially aluminum.

It is an additional object of the present invention to provide an improved method for attaching a semiconductor die to a ceramic base.

It is a further object of the present invention to provide an improved method for attaching a semiconductor die to a ceramic base using an intermediate ductile foil, sealed with or without use of an intermediate glass layer, the ductile foil being in turn sealed by another glass containing layer to the semiconductor die.

It is an additional object of the invention to provide an improved semiconductor device using a glass containing layer for die bonding which has a lower thermal impedance than the prior art.

It is a still further object of the present invention to provide an improved semiconductor device using a glass containing layer for die bonding with an intermediate ductile foil for simultaneously achieving stress relief and lower thermal impedance.

It is a still further object of the present invention to provide an improved semiconductor device using a glass containing layer for die bonding wherein the bonding layer can be thinner than has been possible in the prior art without die or bond cracking.

SUMMARY OF THE INVENTION

The above and other objects and advantages are achieved in accordance with the present invention wherein there is provided an improved electrical device and package structure comprising a ceramic base, a ductile foil bonded to the base with or without a first glass bonding region therebetween, a second glass plus ceramic bonding mixture in contact with the foil for bonding an electrical device such as a semiconductor die to the foil.

There is further provided a manufacturing method wherein the foil is bonded directly to the ceramic base using heat and pressure exceeding the yield strength of the foil, or in an alternate embodiment by using a foil bonding glass which is substantially alkali-free and which is bonded by heating to a temperature exceeding the glass softening point but less than the melting temperature of the base and foil, and by applying sufficient pressure to flow the glass to substantially eliminate voids between the ceramic base and the foil.

The die are bonded to the foil by means of a glass plus ceramic bonding mixture whose softening temperature is less than that of the foil bonding glass and less than the melting temperature of the other materials of the structure. Heat is applied to soften the glass plus ceramic bonding mixture and pressure provided, with or without "scrubbing" the die, to substantially uniformly distribute the die bonding mixture between the die and the foil.

The foil bonding glass has a composition in the range (by weight percent) of:

| | |
|---|---|
| $SiO_2$ | 10–15 |
| PbO | 45–55 |
| ZnO | 8–12 |
| $Al_2O_3$ | 2–5 |
| $B_2O_3$ | 25–30. |

The glass plus ceramic mixture for die bonding consists of a base glass to which has been added 20 to 30 volume percent of powdered lead titanate. The compositions of the base glass and glass plus ceramic mixture are (in weight percent) as follows:

| Constituent | Base Glass Composition | Mixture Composition |
|---|---|---|
| $GeO_2$ | 4–14 | 2.5–10.7 |
| $SiO_2$ | 0–4 | 0–2.3 |
| PbO | 50–80 | 58.6–78.5 |
| $PbF_2$ | 0–7 | 0–5.3 |
| $B_2O_3$ | 11–17 | 7.0–13.0 |
| $Al_2O_3$ | 4–9 | 2.5–6.9 |
| ZnO | 0–7 | 0–5.3 |
| $V_2O_5$ | 0.6–3 | 0.4–2.3 |
| CdO | 0–7 | 0–5.3 |
| $TiO_2$ | 0 | 6.2–9.6. |

BRIEF DESCRIPTION OF THE DRAWINGS

FIG. 2 shows a cross-section in simplified form, greatly enlarged, of the central section of the package of FIGS. 1A–B according to the prior art;

FIG. 3 shows a cross-section in simplified form, greatly enlarged, of the central section of the package of FIGS. 1A–B according to the present invention;

FIG. 4 shows a cross-section in simplified form, greatly enlarged, of the central section of the package of FIGS. 1A–B according to an alternative embodiment of the present invention.

DETAILED DESCRIPTION OF THE DRAWINGS

Figure 1A:
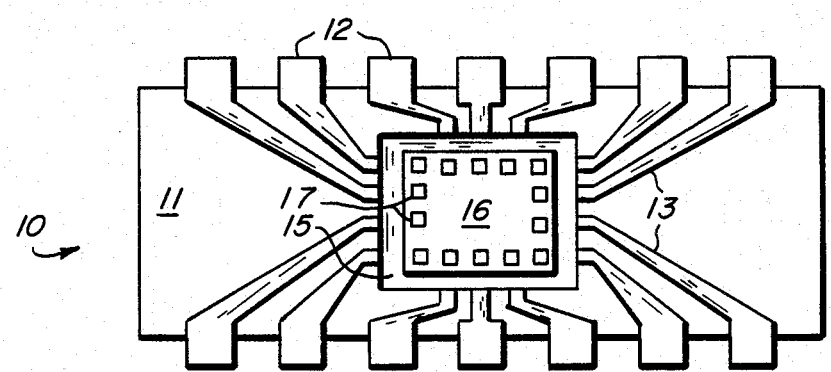
FIG. 1A shows a top view in simplified form of a cerdip package containing a semiconductor chip. The lid or top of the package has been removed so that the interior details are visible.
Figure 1B:
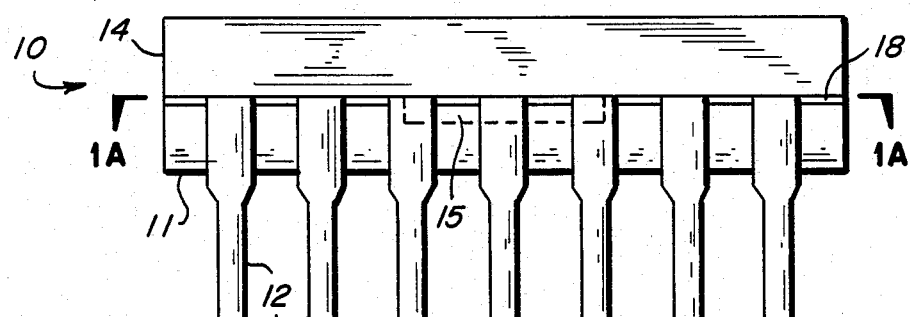
FIG. 1B is a side view in simplified form of the cerdip package of FIG. 1A, with the cover included.

FIGS. 1A–B show, in simplified form, the top view and side view of electrical device 10 which in this case is illustrated as a cerdip package for a semiconductor die. Device 10 includes base 11 which is typically made of a high alumina ceramic and external leads 12 having internal portions 13 lying on base 11. Base 11 contains cavity 15 in which is mounted semiconductor die 16 having connection regions 17. Connection regions 17 are typically electrically connected to internal lead portions 13 of device package 10 by wire bonds (not shown) or similar means well known in the art. In the manufacture of such a device, a lead frame containing lead portions 12 and 13 is mounted on base 11, die 16 is bonded within cavity 15, and wire bonds (not shown) are completed between lead portion 13 and connection regions 17. Cover 14 is attached to base 11 by means of cover sealant 18.

FIG. 2 shows, in simplified form, a greatly enlarged cross-section 20 of base 11 of device 10 in the vicinity of cavity 15 according to the prior art. Metallic leads 12–13 have been omitted for clarity. Cavity 15 has bottom surface 23. Die 16 is mounted in cavity 15 by means of bonding glass 21 of thickness 25, which bonds faces 22 of die 16 to face 23 of base 11. Type DIP-3 glass manufactured by the Kyocera Company of Kyoto, Japan is a typical commercially available prior art die bonding glass.

It has beend found that when thickness 25 of bonding glass 21 of the prior art is reduced signficantly below 2 mils (51 μm), that die fracture and bond failure result. This comes about because of the mechanical stress which arises due to the differential thermal expansion and contraction of the semiconductor chip relative to the ceramic base. For example, when the semiconductor die is silicon, which has a linear coefficient of expansion in the range of $23-45 \times 10^{-7}$ per degree C from room temperature to 500° C., and the base is a high alumina ceramic (typically 95% $Al_2O_3$), which has a linear coefficient of expansion of about $65 \times 10^{-7}$ per degree C, the ceramic base shrinks more than the silicon chip as the combination is cooled from the temperature (about 400° C.) at which the glass solidifies. When a thick glass region is used, that is, about two mils (51 μm) or greater, then the force generated by the differential contraction can be readily absorbed, and the stress remains below the yield strength of the silicon and the glass. As the thickness of the glass layer is reduced, however, the same force is distributed, to a first approximation, across the thinner glass region and the stress increases approximately inversely with the glass thickness. Below about 2 mils (51 μm), the stress within the silicon at the boundary between die 16 and glass region 21 exceeds the fracture strength of the silicon and chip fracture results.

FIG. 3 shows the same cross-section portion 20 of base 11 as in FIG. 2 but with the prior art glass replaced by a means of the present invention. Die 16 is bonded to face 23 of cavity 15 by means of die bonding material 31 of the present invention and ductile foil 32. Ductile foil 32 has face 34 bonded to face 23 of cavity 15. Die bonding material 31 bonds face 22 of die 16 to face 33 of ductile foil 32. Die bonding material 31 has thickness 35.

Foil 32 has thickness 36. Die bonding material 31 is a glass plus ceramic mixture.

FIG. 4 illustrates an alternate embodiment of the present invention, again showing the same cross-section portion 20 of base 11 as in FIG. 2 and 3. In FIG. 4, die 16 is bonded by means of die bonding material 31 to ductile foil 32 which is in turn bonded to face 23 of cavity 15 of base 11 by means of foil bonding glass 41. As used in this application, the words "die bonding material" are intended to designate the glass plus ceramic mixture used for die bonding material 31 or its equivalent located between die 16 and ductile foil 32. As used in this application, the words "foil-glass" or "foil bonding glass" are intended to designate glass material region 41 or its equivalent located between foil 32 and base 11. Glass plus ceramic mixture 31 bonds face 22 of die 16 to face 33 of ductile foil 32. Glass 41 bonds face 34 of ductile foil 32 to face 23 of cavity 15. Ductile foil 32 has thickness 46. Foil bonding glass 41 has thickness 47. Foil bonding glass thickness 47 is typically less than die bonding material thickness 35.

Figure 5:
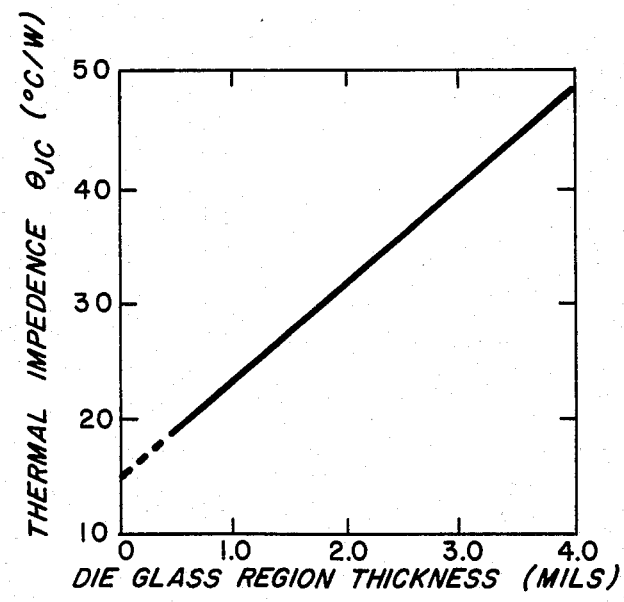
FIG. 5 is a plot of thermal impedance as a function of the thickness of the die bonding mixture.

FIG. 5 is a plot of the measured thermal impedance $\theta JC$ in degrees C per watt as a function of thickness 35 of die bonding region 31, for the configuration shown in FIG. 3, and using the die bonding material compositions of the present invention, to be discussed later. It will be noted that the thermal impedance for a die bonding mixture thickness of 2 mils (51 μm) is approximately 30° C. per watt, comparable to the values typically obtained with prior art glasses of the same thickness. However, as a result of the presence of ductile layer 32, thickness 35 can be reduced to less than one mil (25 μm) without significant die cracking. With such thin die bonding layers, thermal impedance values approaching 20° C. per watt are obtained, matching the performance of metal bonding layers. Comparable or better results are obtained using the alternative embodiment of FIG. 4 for thickness 47 of foil glass region 41 of the order of 0.1 mil (2.5 μm) or less. Thus the present invention makes possible the use of thinner non-metallic die bonds without die or bond cracking, and provides a corresponding improvement in thermal performance of non-metallic bonds.

The following is an example of the practice of the method of the present invention in which a silicon semiconductor die is bonded to an alumina cerdip ceramic base. Ductile foil 32 is placed in cavity 15 of base 11 and bonded to lower surface 23 of cavity 15, in a first alternative, by applying only heat and pressure, and in a second alternative, by applying heat and pressure in conjunction with foil bonding glass 41 between foil 32 and cavity face 23. Aluminum was found to give good results as a ductile foil material and is preferred.

The ductile foil must be chosen from that class of materials which has a predetermined melting temperature greater than the temperatures which will be used during the bonding operations or to which the package will be subjected during subsequent processing, and a predetermined yield strength which is less than the yield strength of the semiconductor die, the package base, and the bonding material used in bonding the die to the package base. Other materials which are believed to be useful are, for example, ductile aluminum alloys, gold, silver, copper, and ductile solder alloys. However, aluminum is particularly desirable because it has a relatively high melting point (660° C.) and, at the same time, a relative low yield strength of 3000 psi (21 MPa), and it adheres well to ceramics, glasses, and glass-ceramic mixtures.

The ductile aluminum foil is directly bonded to the ceramic base by applying a pressure significantly exceeding the yield strength. Pressure values of about 14,000 psi (97 MPa) at a temperature in the range of 550°-650° C. were found to give good results. The pressure is applied by means of a hardened steel tool which presses ductile foil 32 against surface 23 of base 11. A thin layer of fine boron nitride powder dusted onto the hardened steel tool prevents it from sticking to the aluminum.

Alternatively, foil 32 may be bonded to base 11 by means of thin foil bonding glass 41 having a specific composition to be described later. Aluminum foil thickness in the range 2-5 mils (51-127 μm) is preferred as giving the best compromise between ease of handling and bonding performance; however, foil of thickness in the range 1-10 mils (25-254 μm) is also useful. Below about 1 mil (25 μm) shear failure of the aluminum foil is more likely. Thickness greater than 10 mils is believed possible, but additional foil thickness increases the thermal path length without further improvement in the bonding properties.

Foil bonding glass 41 can be applied by spraying, painting, screening, spinning or other techniques well-known in the art. The glass can be applied either to the package base or the foil. Applying the glass to the foil by spraying was found to be a convenient technique. Only a small amount of glass is required with thicknesses of the order of 0.1 mil (2.5 μm) being useful, and with thinner layers in the vicinity of 0.01 mil (0.25 μm) or less being preferred.

The glass-coated aluminum foil was placed in cavity 15 of base 11 and heated to a temperature (e.g. 550°-650° C.) which exceeded the softening point to foil-glass but was less than the melting temperature of the foil (660° C.) or the ceramic base (about 2000° C.). Pressure was applied by means of a steel tool pressing against the upper side of foil 32 so as to cause glass 41 to flow into a substantially uniform layer to fill the voids and interstices of the ceramic surface and accommodate any inhomogeneities in the surface of the foil. A pressure of 14,000 psi (97 MPa) was found to be convenient, but substantially lower pressures are believed to be useful. With the aluminum foil, it was found to be convenient to use foil-glass compositions having a softening temperature in the range 550°-650° C. with the range 610°-650° C. being preferred. In any case, it is essential that the foil bonding glass have a softening temperature which is less than the melting temperature of the ductile foil and greater than the softening temperature of the die bonding material which will be subsequently used to bond the die to the foil.

It was found, in general, that both direct bonding of the aluminum foil to the ceramic base and glass bonding of the aluminum foil to the ceramic base gave satisfactory results. Glass bonding of the foil to the ceramic base produces a stronger bond, and equal or better thermal characteristics.

Die 16 is attached to foil 32 using a die bonding material whose softening temperature is less than the softening temperature of foil bonding glass 41, and which has filler particles small enough to provide thickness 35 of less than one mil (25 μm) and preferably less than 0.5 mil (14 μm). The composition of such a die bonding material will be described subsequently. Die bonding material thickness as thin as about 0.1 mil (2.5 μm) is believed to be useful.

Die bonding material 31 may be sprayed, painted, screen printed, spun or applied by other techniques known in the art onto the package or the semiconductor die. It is preferable to apply the die bonding material to the semiconductor wafer from which the die is derived prior to separating the wafer into individual die.

To effect bonding of the die to the foil, a die coated with the die bonding material is typically placed in contact with the foil, and heat and pressure applied to soften the die bonding material and seal it to the foil. A commercial die-bonder (Unitek 8-140) was found to be suitable for this purpose. Other commercially available die-bonders are believed to serve equally well.

In a typical run, the heater block temperature of the die bonder was adjusted to 575° C. The cerdip base was placed upon this heater block for about 10-15 seconds in order that the temperature of the cerdip base should rise to a value exceeding the softening point of the die bonding material (approximately 530° C.). A coated die measuring 64×64 mils (1.6×1.6 mm) was lifted in a die collet and placed on the foil coated base and held in position for approximately two seconds under a force of 70-90 grams and then scrubbed laterally back and forth for approximately ten seconds in order to insure uniform wetting of the surface of the ductile foil by the die bonding material, to eliminate voids, and to achieve a substantially uniform bonding region between the die and the foil.

A glass which is suitable for bonding the ductile aluminum foil to the ceramic base was discovered, which has the following range of compositions of ingredients by weight percent. The composition shown below are the ranges expected to be obtained by analysis of the finished glass.

| | |
|---|---|
| $SiO_2$ | 10-15 |
| PbO | 45-55 |
| ZnO | 8-12 |
| $Al_2O_3$ | 2-5 |
| $B_2O_3$ | 25-30. |

A typical batch of the foil bonding glass was prepared by melting the following weights of powdered starting materials, as described below.

| Ingredients | Weight in Grams |
|---|---|
| Silica sand ($SiO_2$) | 34.6 |
| Lead silicate (85% PbO + 15% $SiO_2$) | 379.3 |
| Red Lead ($Pb_3O_4$) | 38.4 |
| Zinc Oxide (ZNO) | 75.0 |
| Aluminum Hydrate Al(OH)$_3$ | 40.2 |
| Boric Acid ($H_3BO_3$) | 350.3 |

The above batch of ingredients was melted in a platinum crucible having a diameter and height of three inches (7.6 cm). The crucible was filled about 80% full and lowered into a laboratory Globar furnace held at 1200° C. during the melting and subsequent stirring operations. Following a fifteen minute meltdown of the initial crucible charge, the crucible was removed and additional material was added and the crucible returned to the furnace. This procedure was repeated about four times until all of the batch material had been placed in the crucible.

One half hour after the last addition of material, a platinum stirrer having a two inch (5.4 cm) diameter propellor blade was immersed about one inch (2.5 cm) into the molten glass and the melt stirred at 90 rpm for two hours. The crucible was then removed from the furnace and the molten glass poured into water to produce a glass in frit form. The glass frit was removed from the water and dried at about 100° C. The frit was ground in a ball-mill and screened through a 400 mesh stainless steel sieve. It was also found to be convenient to further wet grind the screened glass powder for six to 24 hours. Terpineol, a material well-known in the art, was used as the liquid for wet grinding, and for application of the glass. The glass can be applied by methods well-known in the art.

The above-described batch of foil bonding glass was found to have a density of 4.1 grams per cubic centimeter, a coefficient of thermal expansion of $52 \times 10^{-7}$ per degree C (25°-300° C.) and a sealing temperature of approximately 600° C. The composition after mixing, melting, and cooling of the above listed batch of foil bonding glass starting materials was calculated to be, in weight percent, as follows:

| | |
|---|---|
| $SiO_2$ | 12.2 |
| PbO | 48.0 |
| ZnO | 10.0 |
| $Al_2O_3$ | 3.5 |
| $B_2O_3$ | 26.3 |
| Total | 100% |

A die bonding material composed of a mixture of the base glass and a powdered ceramic (lead titanate) was found to be useful for sealing silicon die to ductile aluminum foils. The following table lists the constituents in weight percent of the base glass and the base glass plus ceramic mixture. The composition range of the base glass was determined by calculation from a range of experimental samples of different compositions. The composition of the mixture was determined by calculation based on adding from 20 to 30 volume percent powdered lead titanate to the crushed and powdered base glass.

| Constituent | Base Glass Composition | Mixture Composition |
|---|---|---|
| $GeO_2$ | 4-14 | 2.5-10.7 |
| $SiO_2$ | 0-4 | 0-2.3 |
| PbO | 50-80 | 58.6-78.5 |
| $PbF_2$ | 0-7 | 0-5.3 |
| $B_2O_3$ | 11-17 | 7.0-13.0 |
| $Al_2O_3$ | 4-9 | 2.5-6.9 |
| ZnO | 0-7 | 0-5.3 |
| $V_2O_5$ | 0.6-3 | 0.4-2.3 |
| CdO | 0-7 | 0-5.3 |
| $TiO_2$ | 0 | 6.2-9.6. |

The following are two examples of the preparation of a die bonding material having a composition within the range specified above. The following batches of ingredients (in grams) were used to make up base glasses designated R-233 and R-248.

| Ingredients | | Weight in Grams |
|---|---|---|
| R-233 Glass | | |
| Germanium Oxide | $GeO_2$ | 100.0 |
| Lead Oxide | PbO | 634.0 |
| Hammond 75% Red Lead | $Pb_3O_4$/PbO | 50.9 |

-continued

| Ingredients | | Weight in Grams |
|---|---|---|
| (75%/25%) | | |
| Boric Acid | $H_3BO_3$ | 243.3 |
| Aluminum Hydrate | $Al(OH)_3$ | 105.6 |
| Vanadium Pentoxide | $V_2O_5$ | 10.0 |
| R-248 Glass | | |
| Germanium Oxide | $GeO_2$ | 50.0 |
| Lead Silicate (85%/15%) | $PbO/SiO_2$ | 133.0 |
| Lead Oxide | PbO | 554.0 |
| Hammond 75% Red Lead (75%/25%) | $Pb_3O_4/PbO$ | 50.9 |
| Lead Fluoride | $PbF_2$ | 50.0 |
| Boric Acid | $H_3BO_3$ | 243.3 |
| Aluminum Hydrate | $Al(OH)3$ | 75.0 |
| Zinc Oxide | ZnO | 50.0 |
| Vanadium Pentoxide | $V_2O_5$ | 10.0 |
| Cadmium Oxide | CdO | 30.0 |

These batches yielded the following composition of glasses, based on calculation from the starting ingredients allowing for loss of decomposition products during melting. Methods for performing these calculations are well known in the art.

| Ingredient | R-233 Base Glass Composition | R-248 Base Glass Composition |
|---|---|---|
| $GeO_2$ | 10 | 4.5 |
| $SiO_2$ | — | 1.8 |
| PbO | 68.4 | 64.4 |
| $PbF_2$ | — | 4.5 |
| $B_2O_3$ | 13.7 | 12.3 |
| $Al_2O_3$ | 6.9 | 4.4 |
| ZnO | — | 4.5 |
| $V_2O_5$ | 1.0 | 0.9 |
| CdO | — | 2.7 |
| $TiO_2$ | — | — |
| Total | 100% | 100% |

Each batch was melted in a platinum crucible and then ground in a manner similar to that described previously for the foil sealing glass. The raw material was progressively added and melted at 1000° C. in a Globar furnace, stirred at 90 rpm for two hours, and then poured into water to produce a frit which was then crushed and ground to a fine powder. In some cases the glass frit was also ground wet using a Terpineol carrier in the same manner as the foil sealing glass.

Prior to dilution with lead titanate the R-233 and R-248 glasses had the following properties:

| | R-233 Base Glass | R-248 Base Glass |
|---|---|---|
| Density (grms/cm$^3$) | 6.08 | 5.62 |
| Expansion Coefficient ($\times 10^7$ per °C. from 25 to 300° C.) | 87 | 84 |
| Anneal Point (°C.) | 395 | 353 |

A Dupont model T-900 differential thermal analyzer was used to measure the anneal point. The thermal expansion was measured on an Orton Dilatometer.

The finely powdered base glass was mixed with 20 to 30 volume percent of Perovskite phase lead titanate powder having a particle size less than 8 microns and a specific gravity of approximately 7.5. Twenty volume percent of the lead titanate corresponds to 23.6 weight percent when mixed with the R-233 base glass and 25.0 weight percent when mixed with the R-248 base glass. Thirty volume percent of the lead titanate corresponds to 34.6 weight percent when mixed with the R-233 base glass and 36.4 weight percent when mixed with the R-248 base glass. For example, to obtain a 20 volume percent glass plus ceramic mixture with the R-248 glass, 750 grams of the R-248 base glass was mixed with 250 grams of the powdered lead titanate. To obtain a 30 volume percent mixture with the R-248 glass, 636 grams of R-248 base glass was mixed with 364 grams of the powdered lead titanate.

The glass plus ceramic die bonding mixture, prepared as described, had a calculated composition, when combined with twenty to thirty volume percent lead titanate, as listed in the following table under the headings R-233 and R-248. The compositions are given in weight percent. The observed physical properties are included.

| | R-233 with 20 Volume Percent Lead Titanate | R-248 with 20 Volume Percent Lead Titanate | R-248 with 30 Volume Percent Lead Titanate |
|---|---|---|---|
| $GeO_2$ | 7.6 | 3.4 | 2.9 |
| $SiO_2$ | — | 1.4 | 1.1 |
| PbO | 69.6 | 66.6 | 67.7 |
| $PbF_2$ | — | 3.4 | 2.9 |
| $B_2O_3$ | 10.5 | 9.2 | 7.8 |
| $Al_2O_3$ | 5.3 | 3.3 | 2.8 |
| ZnO | — | 3.4 | 2.9 |
| $V_2O_5$ | 0.8 | 0.7 | 0.6 |
| CdO | — | 2.0 | 1.7 |
| $TiO_2$ | 6.2 | 6.6 | 9.6 |
| Total | 100.0% | 100.0% | 100.0% |
| Coefficient of Thermal Expansion $\times 10^7$ from 25 to 300° C. | 60 | 65 | 59 |
| Bonding Temperature in °C. | 530 | 500 | 500 |

The designations R-233 and R-248 refer to experimental identification numbers. The above listed die bonding mixtures were found to give satisfactory results for bonding silicon semiconductor die to ductile aluminum foils in cerdip packages.

Thus it is apparent that there has been provided in accordance with this invention, improved glass compositions for sealing ductile foils (particularly aluminum) to ceramic bases, and improved glass plus ceramic mixtures for sealing semiconductor die and other components to these foils. The die bonding mixture is also expected to be useful for sealing die to other materials or objects, such as ceramic bases and enclosures.

There is also provided improved means and methods for bonding a ductile foil to a ceramic base and for attaching a semiconductor die to a foil cover ceramic base using glass containing bonding materials. There is further provided improved semiconductor devices utilizing glass containing bonding means wherein the devices have a lower thermal impedance than that obtainable with prior art glass die bonds.

Having thus described the invention, it will be obvious to those of skill in the art that various modifications can be made within the spirit and scope of the present invention. For example, semiconductor die of materials of other than silicon may be utilized, providing their melting point or decomposition temperature exceeds the softening temperatures of the glass or glass plus ceramic mixtures. Other base materials may be utilized besides ceramic, provided their melting or softening temperatures exceed the softening temperatures of the glasses or glass plus ceramic mixtures used. Other ductile foil materials besides aluminum may be used provided their yield strength is less than the yield strength of the semiconductor die, the base, and the glass or glass plus ceramic materials employed, and their melting temperatures exceed the softening temperature of the glass or glass plus ceramic materials utilized. It is intended to encompass all such variations as fall within the spirit and scope of the invention.

We claim:

1. A glass material consisting essentially of a composition by weight percent of:

| | |
|---|---|
| $GeO_2$ | 4–14 |
| $SiO_2$ | 0–4 |
| PbO | 50–80 |
| $PbF_2$ | 0–7 |
| $B_2O_3$ | 11–17 |
| $Al_2O_3$ | 4–9 |
| ZnO | 0–7 |
| $V_2O_5$ | 0.6–3 |
| CdO | 0–7 | and having a coefficient of thermal expansion in the range $84-87 \times 10^{-7}/°C.$ from 25° to 300° C.

2. A glass plus ceramic mixture having a coefficient of thermal expansion in the range of about $59-65 \times 10^{-7}/°C.$ (25°–300° C.), comprising a powdered base glass of composition by weight percent consisting essentially of:

| | |
|---|---|
| $GeO_2$ | 4–14 |
| $SiO_2$ | 0–4 |
| PbO | 50–80 |
| $PbF_2$ | 0–7 |
| $B_2O_3$ | 11–17 |
| $Al_2O_3$ | 4–9 |
| ZnO | 0–7 |
| $V_2O_5$ | 0.6–3 |
| CdO | 0–7 | plus 23.6 to 36.4 weight percent powdered lead titanate, the combination forming said glass plus ceramic mixture.

3. A glass containing material comprising an admixture of a titania free crushed base glass having a coefficient of thermal expansion in the range $84-87 \times 10^{-7}/°C.$ from 25° to 300° C., and 23.6 to 36.4 weight percent lead titanate powder, wherein the mixture consists essentially of ingredients by weight percentage in the range of:

| | |
|---|---|
| $GeO_2$ | 2.5–10.7 |
| $SiO_2$ | 0–2.3 |
| PbO | 58.6–78.5 |
| $PbF_2$ | 0–5.3 |
| $B_2O_3$ | 7.0–13.0 |
| $Al_2O_3$ | 2.5–6.9 |
| ZnO | 0–5.3 |
| $V_2O_5$ | 0.4–2.3 |
| CdO | 0–5.3 |
| $TiO_2$ | 6.2–9.6 |

* * * * *